US007507505B2

(12) United States Patent
Lee et al.

(10) Patent No.: US 7,507,505 B2
(45) Date of Patent: Mar. 24, 2009

(54) FABRICATION METHOD OF EXTREME ULTRAVIOLET RADIATION MASK MIRROR USING ATOMIC FORCE MICROSCOPE LITHOGRAPHY

(75) Inventors: Hai Won Lee, Seongnam-si (KR); Sun Woo Lee, Seoul (KR); Jin ho Ahn, Seoul (KR); Suk Jong Bae, Seoul (KR)

(73) Assignee: IUFC-HYU (Industry-University Cooperation Foundation Hanyang University), Seoul (KR)

( * ) Notice: Subject to any disclaimer, the term of this patent is extended or adjusted under 35 U.S.C. 154(b) by 512 days.

(21) Appl. No.: 10/578,683

(22) PCT Filed: Jun. 8, 2004

(86) PCT No.: PCT/KR2004/001363

§ 371 (c)(1),
(2), (4) Date: May 9, 2006

(87) PCT Pub. No.: WO2005/050719

PCT Pub. Date: Jun. 2, 2005

(65) Prior Publication Data
US 2007/0054196 A1 Mar. 8, 2007

(30) Foreign Application Priority Data
Nov. 20, 2003 (KR) ...................... 10-2003-0082777

(51) Int. Cl.
*G03F 1/00* (2006.01)
*G03C 5/00* (2006.01)
(52) U.S. Cl. .......................................... 430/5; 430/323
(58) Field of Classification Search ................ 430/5, 430/322, 323, 324; 375/35
See application file for complete search history.

(56) References Cited

U.S. PATENT DOCUMENTS

| 4,329,410 | A | 5/1982 | Buckley |
| 6,110,607 | A | 8/2000 | Montcalm et al. |
| 6,228,512 | B1 | 5/2001 | Bajt et al. |
| 6,229,652 | B1 | 5/2001 | Bajt et al. |
| 6,338,990 | B1 | 1/2002 | Yanai et al. |
| 6,770,903 | B2 * | 8/2004 | Lin et al. ...................... 257/30 |

OTHER PUBLICATIONS

Ryu; "Method for Manufacturing a Semiconductor Device"; Korean Patent Abstracts of KR 1020000073498 A, May 12, 2000.

(Continued)

*Primary Examiner*—Stephen Rosasco
(74) *Attorney, Agent, or Firm*—Finnegan, Henderson, Farabow, Garrett & Dunner

(57) ABSTRACT

The present invention relates to a method for manufacturing a reflective multi-layered thin film mirror for an extreme ultraviolet radiation (EUV) exposure process that is one of the next generation exposure process masks using an atomic force microscope (AFM). This reflective multi-layered thin film mirror for extreme ultraviolet radiation (EUV) exposure process allows metal oxide structures with fixed height and ' width to be obtained using anodic oxidization phenomenon between the cantilever tip of a atomic force microscope and an absorber material during the patterning of an absorber layer on a multi-layered thin film of a substrate, followed by forming the ultra-fine line width absorber patterns via etching of the metal oxide structure. Use of the manufacturing process of this invention is advantageous in manufacturing of extreme ultraviolet radiation exposure mask mirrors with high resolution and in manufacturing of reflective multi-layered thin film mirrors with minute absorber pattern sizes (less than 20 nm line width) compared to traditional manufacturing methods.

3 Claims, 5 Drawing Sheets

OTHER PUBLICATIONS

Matsuo et al.; "Manufacture of Mask for Exposure to X-ray and Blank Used Therewith"; Patent Abstracts of Japan of JP 05-283323, Oct. 29, 1993.

Sundermann et al.; "Nanopatterning of Au Absorber Films on Mo/Si EUV Multilayer Mirrors by STM Lithography in Self-Assembled Monolayers"; Surface Science, vol. 454-456, pp. 1104-1109, (2000).

* cited by examiner

Cr

2μm/div

2μm/div

FABRICATION METHOD OF EXTREME ULTRAVIOLET RADIATION MASK MIRROR USING ATOMIC FORCE MICROSCOPE LITHOGRAPHY

BACKGROUND OF INVENTION

1. Field of Invention

The present invention relates to a manufacturing method of a reflective multi-layered thin film mirror for extreme ultraviolet radiation exposure process using atomic force microscope lithography, by forming a metal oxide structure with fixed height and width on a substrate using the anodic oxidation phenomenon between the probe of an atomic force microscope and an absorber for patterning of an absorber material deposited on the multi-layered thin film substrate, wherein the metal oxidic layer is etched to obtain an ultra-fine line patterned absorber.

2. Description of Related Art

In manufacturing semiconductor elements, the optical lithographic process is the core process in creating circuit patterns by refractive light on a substrate coated with a light sensing film sensitive to light. Lasers are used as light sources, but traditional optical exposure processes have reached their limits in that they cannot be applied to manufacturing substrates with a minimum line width of less than 70 nm.

Therefore, new sources of radiation such as extreme ultraviolet radiation (EUV), electron beam, X-ray, and ion beam are being studied, with the extreme ultraviolet radiation and the electron beam being spotlighted as the next generation exposure technologies.

Particularly, the EUV exposure is the most promising technology among many next generation exposure processes, and the reflective multi-layered thin film mirror that allows Bragg reflections may be considered as the core factor in an exposure process using EUV.

A reflective mirror is used to transfer mask images to a semiconductor substrate by reflecting light in EUV exposure process, unlike traditional refractive optical systems and transparent masks. The yield of elements is affected mostly by the reflectivity of each mirror so that manufacture of mirrors with high reflectivity and low imperfection is essential for it to be applied to next generation exposure technology.

Radiations within the range of EUV wavelength are absorbed by matters and cannot pass through them. Thus, laminated structures of Mo layers and Si layers are being used in current development of multi-layered thin film mirrors because of their large differences in optical refraction as described in U.S. Pat. No. 6,110,607.

Further, various other materials have been used to manufacture multi-layered thin films with reflectivity superior than Mo/Si multilayered thin films. For instance, $Mo_2C/Be$ multi-layered thin film is described in U.S. Pat. No. 6,229,652, and MoRu/Be multi-layered thin film is described in U.S. Pat. No. 6,228,512.

On the other hand, recent semiconductor technologies demand a decreased element pattern sizes because of high integration of elements with simultaneous integration of many elements, requiring the embodiment of minute patterns during exposure processes in order to decrease pattern sizes of elements.

The next generation lithographic EUV exposure mask requires multi-layered thin films with sufficient reflective property to accommodate the absorption of EUV at 13.5 nm wavelength by matter. And, it is extremely important to obtain minute patterns on absorbers in order to decrease the corresponding pattern sizes of elements.

This type of exposure masks for the next generation lithography also rely on an electron beam lithography apparatus for the implementation of minute patterns like the traditional photo mask as explained below.

As shown in FIG. 1, the manufacturing process of a reflective multi-layered thin film mirror involves deposition of a multi-layered thin film, a capping layer and an absorber layer on a silicon substrate (1), followed by a patterning process. Traditionally, electron beam lithographic technology was used for patterning of an absorber layer.

More specifically, a reflective multi-layered thin film is obtained by depositing a multi-layered thin film (3) such as Mo/Si basic structure, Ru/Mo/Si which is an enhancement of multi-layered thin film material based on basic Mo/Si structure, $Mo_2C/Be$ structure, or MoRu/Be structure on silicon substrate (1), then a capping layer (5) such as silicon oxide is deposited on top to protect this multi-layered thin film (3).

Next, an absorber layer (7) such as chromium (Cr) is deposited on above-mentioned multi-layered thin film structure, followed by patterning of an absorber layer (7) such as chromium that has been deposited in the surface of multi-layered thin film structure by electron beam lithography. Chromium (Cr), Tantalum (Ta), or Tungsten (W) is deposited as an absorber material on the multi-layered thin film substrate and coated with resistant material for patterning of this absorber layer.

A resistant layer is patterned into few nm wide grooves by electron beam lithography, substructure of the absorbing thin film processed using dry etching or wet etching, then the resistant materials eliminated by washing to obtain a patterned mask with desired appearance. But, if an electron beam lithography such as the one mentioned above is used to pattern an absorbing layer, electron beam scattering causes damages to the substrate. Minute patterns are also hard to achieve and the attainable line width is limited to around 30 nm.

Therefore, a new method is needed that can maintain the properties of the next generation lithographic EUV exposure mask mirror, overcome the limitations of line with of patterns, and eliminate the need for expensive electron lithography system and high vacuum.

M. Sundermann reported the following results in a published study using gold (Au) as the absorbing material on a Mo/Si multi-layered thin film (M. Sundermann, and 7 others, Surface Science, v. 454-456, p. 1104, 2000). In this study, gold was deposited as the absorber material on the surface of multi-layered thin film, followed by self-assembled monolayer (SAM) as the resistant material on top of it. Then the SAM was selectively corrupted using scanning tunneling microscope lithographic process, and the exposed absorbent material was etched while wetting to obtain a pattern.

But, this method can only be applied to absorbing materials that do not oxidize such as gold. Thus, a method is needed that can be applied to all materials with high absorbance coefficients and allow realization of pattern images with better structural shapes by either wet or dry etching of formed oxidized materials.

The purpose of this invention is to resolve the above-mentioned problems by providing methods to produce reflective multi-layered thin film mirrors for extreme ultraviolet radiation exposure processes that allow realization of few nm wide absorber patterns by using an atomic force microscope, thereby overcoming the line width limitations encountered with the traditional electron beam lithography. This allows monumental decreases in the absorber pattern size of thin film mirrors and does not require an expensive electron beam lithographic device and high vacuum.

DETAILED DESCRIPTION OF INVENTION

This invention relates to a method for manufacturing reflective multi-layered thin film mirrors for extreme ultraviolet radiation exposure processes, comprising: depositing reflective multi-layered thin film and protective layer on a silicon substrate; depositing a thin film of chromium, tantalum, or tungsten on this multi-layered thin film and protective layer; generating an oxidized metal structure with fixed height and width on the substrate surface by impressing electric field between a cantilever tip and the above-mentioned multi-layer structured substrate using an atomic force microscope; and etching this metal oxide structure to obtain an ultra-fine line width absorber pattern.

The manufacturing process of this invention further comprises depositing thin organic film as a resistant material on a thin absorber metal film after the deposition of a thin absorber metal film, and cleaning off this thin organic layer after etching the metal oxide layer. In addition, the conditioning of pattern size through adjusting applied electric field, lithographic speed, and humidity is included in the formation step of the above-mentioned metal oxide structures.

Following is a more detailed explanation with reference to appended drawings.

This invention is a next generation technology that can be applied to lithographic processes in manufacturing of semiconductor related items such as semiconductor memory element and TFT-LCD, wherein lithographic techniques employing atomic force microscope for nanolithography are used to pattern absorbing materials and obtain the reflective multi-layered thin film mirror for extreme ultraviolet exposure processes.

Particularly, this invention relates to obtaining an absorber pattern by wet or dry etching of oxidized maturing oxidized material on the substrate through a water column between a cantilever tip and a substrate after irradiating electrons by applying a fixed amount of voltage between an atomic force microscope's cantilever tip and a substrate during patterning of an absorber material.

By means of the manufacturing process of this invention, the pattern size of an absorber can be reduced to less than few nm using atomic force microscope lithography compared to minute pattern of about 30 nm obtained with traditional electron beam lithographic technology.

Following is a more detailed explanation of an example embodying the desired properties of this invention.

FIG. 2 shows the embodiment of manufacturing process of a reflective multi-layered thin film mirror according to this invention, and FIG. 3 shows a different embodiment of manufacturing process of a reflective multi-layered thin film mirror according to this invention.

As shown in drawings, manufacturing of a reflective multi-layered thin film mirror with ultra-fine pattern size of few nm first requires deposition of a high reflective multi-layer on a silicon substrate, followed by deposition of a capping layer (5) made of such a material as silicon oxide ($SiO_2$) to form a multi-layered structure.

The example in FIG. 2 shows a lamination of Mo/Si structured multi-layer (3) on a silicon substrate (1), and the example in FIG. 3 shows a lamination of Ru/Mo/Si structured multi-layer (3).

Next, the absorber material (7) is deposited on the above-mentioned multi-layered thin film (3) and capping layer (5) in order to construct patterns using chromium (Cr), tantalum (Ta), or Tungsten (W).

A Magnetron Sputter MS-2100 is then used to deposit a thin metal film of the absorber material, chromium, tantalum, or tungsten, under argon ambient of 100-500 W DC power and 1-10 mtorr pressure to obtain a thin metal film of 2-10 nm thickness.

In this manner, this invention uses a sputtering system for simultaneous deposition of a multi-layered thin film and an absorber layer reducing substrate contamination. A reduction in the surface roughness value which is an important factor in a lithographic process in obtaining minute patterns using an atomic force microscope is also obtained in this way.

Next, the absorber material (7) is patterned after its deposition in above-mentioned manner by applying an electric field in the space between the cantilever tip of an atomic force microscope and the multi-layered thin film structure by applying (−) and (+) voltages respectively on them (FIG. 4).

If an electric field is applied between a cantilever tip (11) and a substrate (10), a metal oxide structure (9) with fixed height and width is obtained as shown in FIGS. 2 and 3. And, the metal oxide layer is selectively matured on a substrate through a water column between the cantilever tip and the substrate caused by an applied electric field.

The protruding metal oxide structure (9) formed using atomic force microscope lithography has heights of less than few nm and width of a few tens of nm. The pattern size of an absorber (7) is determined by these height and width.

The height and width of a metal oxide structure (9) obtained during a lithographic process using an atomic force microscope are controlled by applied voltage, lithographic speed, and humidity in the manufacturing process of this invention.

During this process, a metal oxide product (9) equivalent to the one obtained in absence of resistant organic material is obtained when a resistant organic material (8) is coated on the absorber layer (7) during lithographic process as in FIG. 3, and this further increases the selectivity during an etching process.

Following is a more detailed explanation with reference to FIG. 4 of this lithographic process using an atomic force microscope for the manufacturing process of this invention.

FIG. 4 is a simplified drawing to explain the mechanism of an atomic force microscope lithographic process, wherein the following reaction occurs when a water column is formed between a cantilever tip (11) and a substrate (10) caused by electron irradiation. This electron irradiation is effected by applying a few to a few tens of volts in between an atomic force microscopic cantilever tip (11) and a substrate (10).

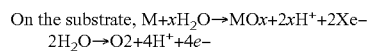

On the substrate, $M + xH_2O \rightarrow MOx + 2xH^+ + 2Xe-$
$2H_2O \rightarrow O2 + 4H^+ + 4e-$

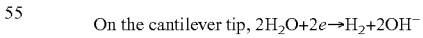

On the cantilever tip, $2H_2O + 2e \rightarrow H_2 + 2OH^-$

An ionic diffusion of OH— and O— ions towards the substrate occurs as a result of above reactions, and anodic oxidation occurs on the substrate producing the layer of oxides (9 in FIGS. 2 and 3).

FIGS. 5 and 7 show surface images of atomic force microscope of formed oxides produced by atomic force microscope under conditions of 5-25 V applied voltage, 30-60% humidity, lithographic speed of 1-10 um/sec.

Lastly, dry or wet etching is performed on oxidized materials after formation of oxidized structure such as the one mentioned above. A reflective multi-layered thin film mirror with ultra-fine line width absorber pattern is obtained and the resistant material is washed off.

A fine pattern down to a few nm wide as well as various pattern images can be obtained without any damage to a substrate using an atomic force microscope in the lithographic step of a semiconductor manufacturing process following the above-mentioned manufacturing process of this invention.

Especially, the manufacturing process of this invention overcomes the limitations of traditional electron beam lithography allowing less than 30 nm ultra-fine absorber patterns to be obtained. Using this process, a reflective multi-layered thin film can be obtained for ultra-fine patterned extreme ultraviolet radiation exposure process that allows transcriptions of various few nm wide mask pattern images on substrates.

BRIEF DESCRIPTION OF THE DRAWINGS

The aforementioned aspects and features of the present invention will be explained in the following description in connection with the accompanying drawings, wherein.

Figure 1:
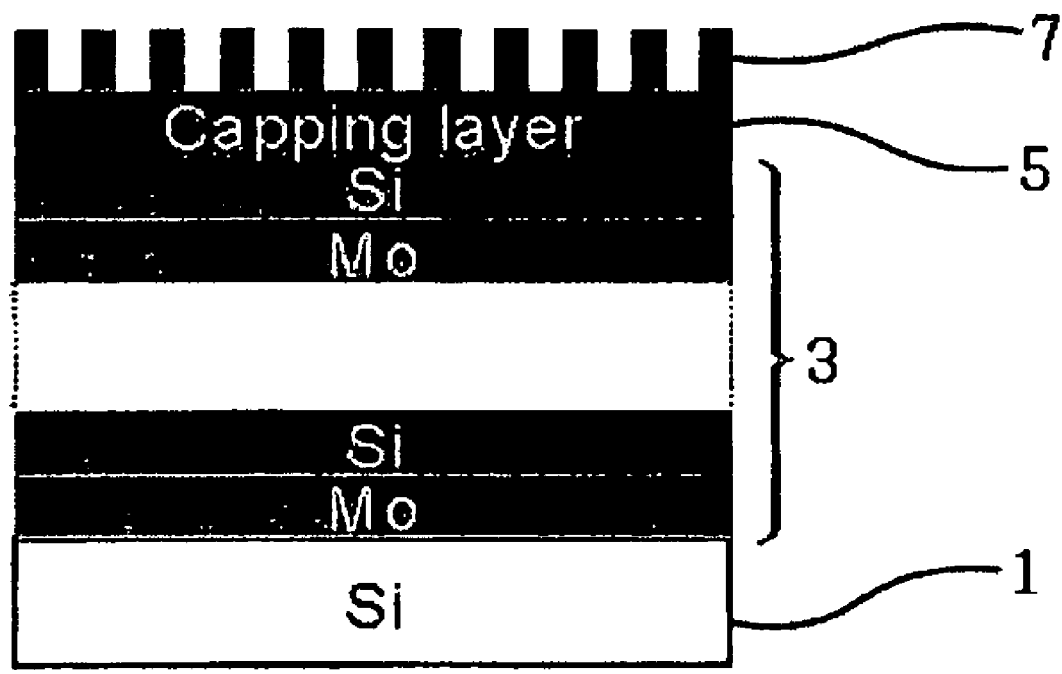
FIG. 1 shows an ordinary reflective mirror having a multi-layered thin film structure.
Figure 2:
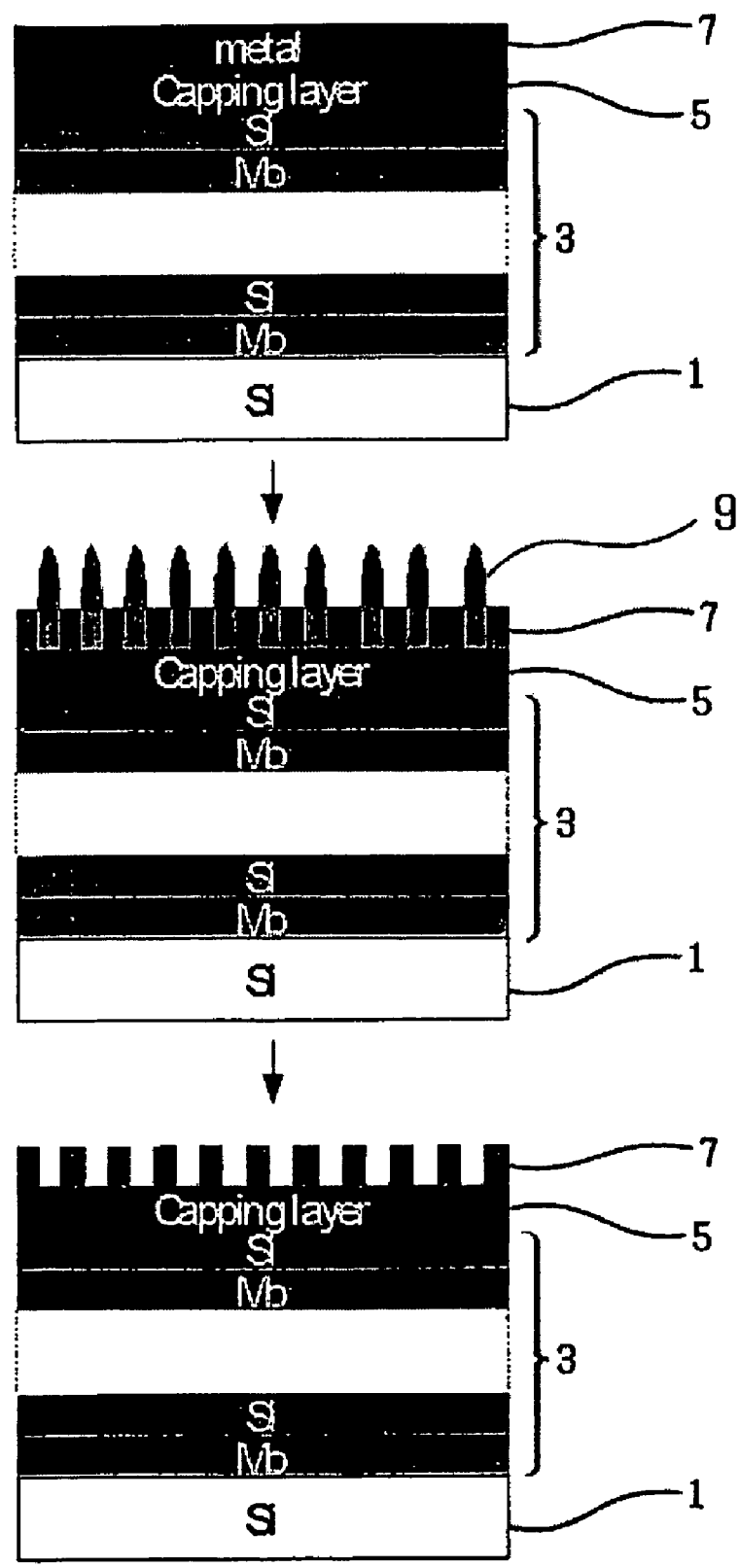
FIG. 2 shows an embodiment of reflective multi-layered thin film mirror manufacturing process of this invention.
Figure 3:
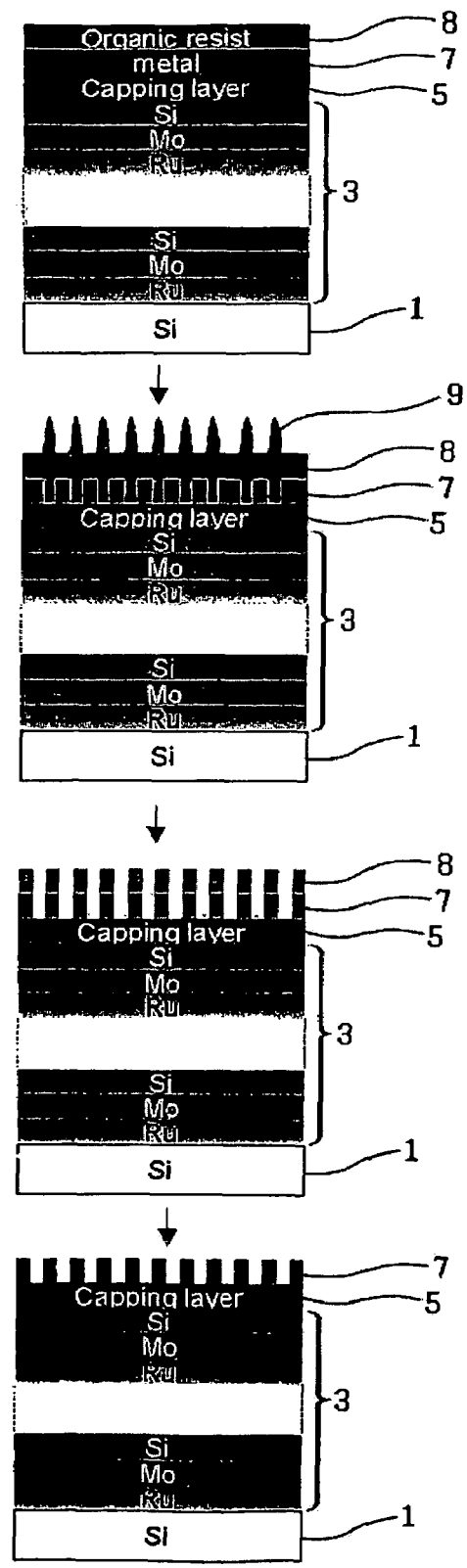
FIG. 3 shows another embodiment of reflective multi-layered thin film mirror manufacturing process of this invention.
Figure 4:
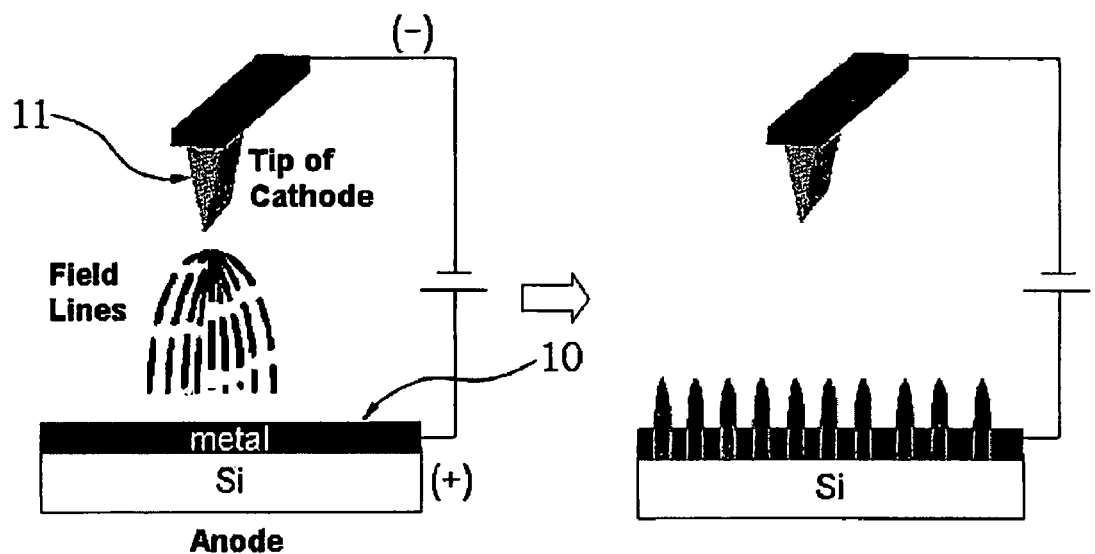
FIG. 4 shows the mechanism of atomic force microscope lithography technology used in the manufacturing process of this invention.
Figure 5:
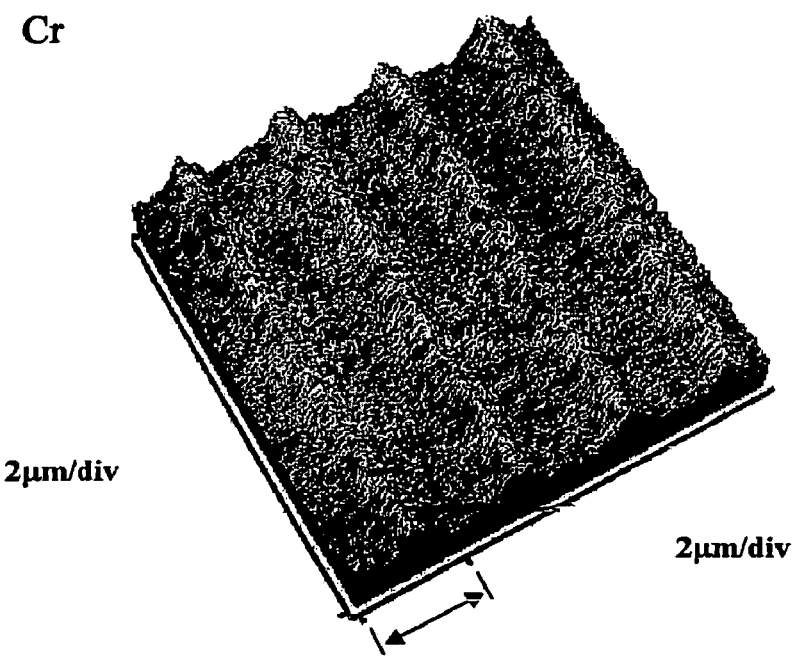
FIGS. 5-7 show a surface image of an absorber material after a lithographic process using an atomic force microscope in accordance with the manufacturing process of this invention.
Figure 6:
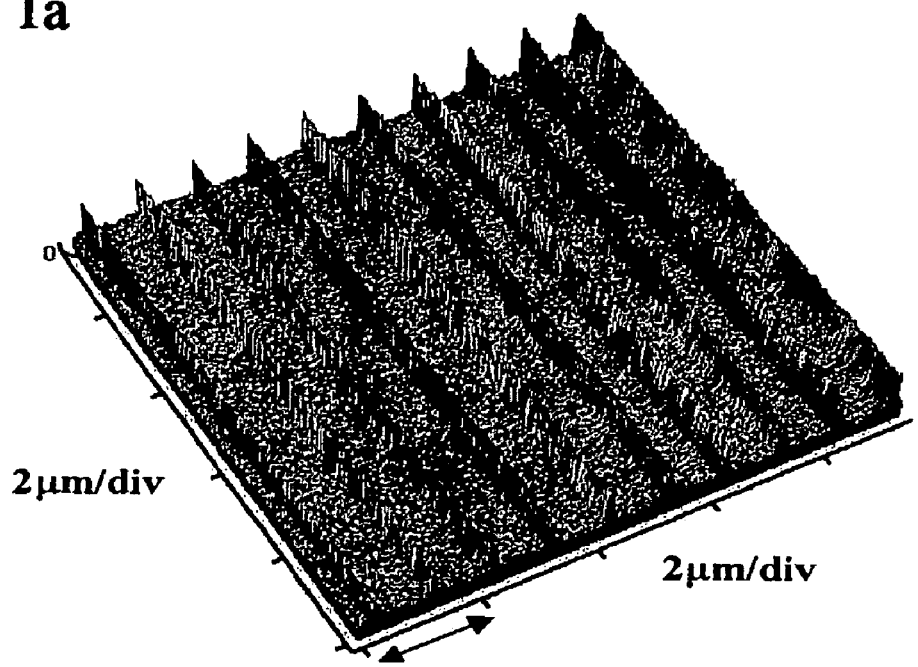
Figure 7:
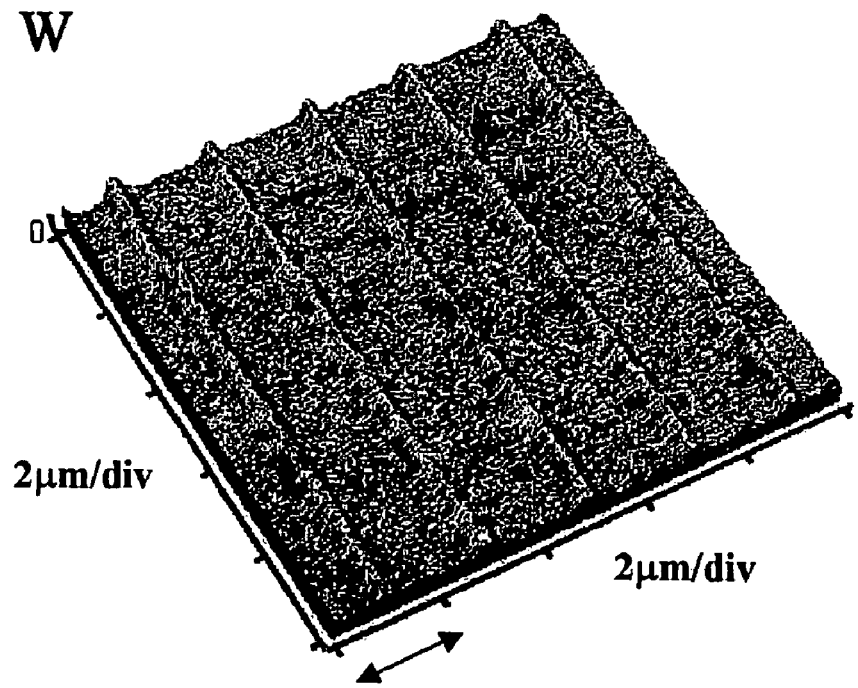

| <Explanation of Parts in Drawings> | |
|---|---|
| 1: silicon substrate | 3: multi-layered thin film |
| 5: capping layer | 7: absorber |
| 8: resistant organic layer | 9: metal oxide structure |
| 10: substrate | 11: cantilever tip |

INDUSTRIAL APPLICABILITY

As stated above, the manufacturing method of reflective multi-layered thin film mirrors for extreme ultraviolet radiation exposure processes according to the present invention enables the use of atomic force microscope lithography during patterning of absorbers allows manufacturing of reflective multi-layered thin film mirrors for ultra-fine patterned extreme ultraviolet radation exposures which in turn allow transcriptions of variously patterned few nm wide mask pattern images on substrates during the exposure processes.

In addition, ultra-fine patterns of less than 30 nm line width limitation imposed by the traditional electron beam lithography can be obtained without any damage to substrates, allowing possible variations in pattern images and decreases in element size.

Furthermore, the manufacturing process of this invention has the advantages of not requiring the use of expensive electron beam lithography system and high vacuum conditions.

The absorber patterning process using atomic force microscope lithography applied in the manufacturing process of this invention shows high absorbance coefficient and can be applied to all absorber materials composed of metal oxides.

Types of manufacturing processes of this invention can be applied usefully to lithographic processes in manufacturing of semiconductor related items such as semiconductor memory elements and TFT-LCD.

What is claimed is:

1. A method of manufacturing reflective multi-layered thin film mirror for extreme ultraviolet radiation exposure processes using atomic force microscopic lithographic technology comprising:
   (a) depositing a reflective multi-layered thin film and a capping layer on a silicon substrate;
   (b) depositing a thin metal film selected from the group consisting of chromium, tantalum, and tungsten as an absorber layer on said multi-layered thin film and said capping layer;
   (c) selectively forming metal oxide structures with fixed height and width on substrates by applying electric field between cantilever tip and said multi-layered structure of the substrate using an atomic force microscope; and
   (d) forming ultra-fine line width absorber patterns by etching of said metal oxide structure.

2. In claim 1, said method further comprises a step of depositing of thin organic film as a resistant material on said thin absorber metal film after the step of depositing a thin metal film as an absorber layer, and is characterized by washing off of this thin organic film after etching of said metal oxide structure.

3. In claim 1, said forming of metal oxide structure comprises a step of controlling pattern sizes via adjustment of applied voltage, lithographic speed and humidity.

* * * * *